US012696509B2

(12) United States Patent
Nakamura et al.

(10) Patent No.: US 12,696,509 B2
(45) Date of Patent: Jul. 28, 2026

(54) SIC WAFER HAVING AN END REGION WITH LOW CONCENTRATIONS OF METAL IMPURITIES AND SIC EPITAXIAL WAFER

(71) Applicant: Resonac Corporation, Tokyo (JP)

(72) Inventors: Yumiko Nakamura, Tokyo (JP); Yuzo Sasaki, Tokyo (JP)

(73) Assignee: Resonac Corporation, Tokyo (JP)

( * ) Notice: Subject to any disclaimer, the term of this patent is extended or adjusted under 35 U.S.C. 154(b) by 391 days.

(21) Appl. No.: 18/396,164

(22) Filed: Dec. 26, 2023

(65) Prior Publication Data

US 2024/0213329 A1      Jun. 27, 2024

(30) Foreign Application Priority Data

Dec. 27, 2022    (JP) ................................. 2022-209847

(51) Int. Cl.
| | |
|---|---|
| *H10D 62/832* | (2025.01) |
| *C30B 29/36* | (2006.01) |
| *H10P 70/00* | (2026.01) |
| *H10P 90/00* | (2026.01) |
| *C30B 23/02* | (2006.01) |

(52) U.S. Cl.
CPC ......... *H10D 62/8325* (2025.01); *C30B 29/36* (2013.01); *H10P 70/15* (2026.01); *H10P 90/128* (2026.01); *H10P 90/129* (2026.01); *C30B 23/025* (2013.01)

(58) Field of Classification Search
CPC ...... H10P 70/15; H10D 62/60; H10D 62/834; H10D 62/8325; C30B 29/36
See application file for complete search history.

(56) References Cited

U.S. PATENT DOCUMENTS

| | | | | |
|---|---|---|---|---|
| 2006/0234058 A1* | 10/2006 | Ohmi | ...................... | C30B 29/36 |
| | | | | 257/E21.228 |
| 2016/0032486 A1* | 2/2016 | Hansen | ................... | C30B 23/02 |
| | | | | 117/109 |
| 2017/0306526 A1* | 10/2017 | Okita | ...................... | C30B 33/10 |
| 2022/0220637 A1* | 7/2022 | Honke | ................... | C30B 29/36 |
| 2022/0220638 A1* | 7/2022 | Okita | ...................... | C30B 29/36 |
| 2023/0357957 A1* | 11/2023 | Okita | ................... | C01B 32/956 |

FOREIGN PATENT DOCUMENTS

| | | | | | |
|---|---|---|---|---|---|
| CN | 106910674 A | * | 6/2017 | ........... | H10P 50/283 |
| JP | 2022-051689 A | | 4/2022 | | |
| JP | 7095765 B2 | | 7/2022 | | |
| WO | 2020/235225 A1 | | 11/2020 | | |

OTHER PUBLICATIONS

CN-106910674-Machine Translation (Year: 2017).*

* cited by examiner

*Primary Examiner* — Younes Boulghassoul
(74) *Attorney, Agent, or Firm* — Sughrue Mion, PLLC

(57) ABSTRACT

A SiC wafer according to the present embodiment includes an end region within 5 mm from an outer circumferential end, wherein, in the end region, the concentration of each of Ti, V and Zr is $5.0 \times 10^{11}$ atoms/cm$^2$ or less, the concentration of each of Cr, Ni, Cu, W, Mo and Mn is $1.0 \times 10^{11}$ atoms/cm$^2$ or less, and the concentration of each of B, Al and Fe is $5.0 \times 10^{12}$ atoms/cm$^2$ or less.

10 Claims, 3 Drawing Sheets

SIC WAFER HAVING AN END REGION WITH LOW CONCENTRATIONS OF METAL IMPURITIES AND SIC EPITAXIAL WAFER

BACKGROUND OF THE INVENTION

Field of the Invention

The present invention relates to a SiC wafer and a SiC epitaxial wafer. Priority is claimed on Japanese Patent Application No. 2022-209847, filed Dec. 27, 2022, the contents of which are incorporated herein by reference.

Description of Related Art

Compared to silicon (Si), silicon carbide (SiC) has an insulation breakdown electric field that is one order of magnitude larger and a band gap which is three times thereof. In addition, silicon carbide (SiC) has characteristics such as a thermal conductivity that is about three times that of silicon (Si). Therefore, silicon carbide (SiC) is expected to be able to be applied to power devices, high frequency devices, high temperature operation devices, and the like. Therefore, in recent years, SiC epitaxial wafers have been used for the semiconductor devices such as those mentioned above.

A SiC epitaxial wafer is obtained by laminating a SiC epitaxial layer on a surface of a SiC wafer. Hereinafter, a wafer before the SiC epitaxial layer is laminated will be referred to as the SiC wafer, and a wafer after the SiC epitaxial layer is laminated will be referred to as the SiC epitaxial wafer. The SiC wafer is cut out from a SiC ingot. Transistors and wirings are formed on the SiC epitaxial layer of the SiC epitaxial wafer and the SiC epitaxial wafer is formed into chips to obtain SiC devices.

For example, as described in Patent Document 1, the main surface of the SiC wafer on which the SiC epitaxial layer is formed may be subjected to chemical mechanical polishing (CMP). The slurry used for CMP may contain a metal oxidizing agent. If cleaning after CMP is insufficient, the metal oxidizing agent may remain as metal impurities. Patent Document 1 describes that impurities remaining on the main surface can be removed by cleaning with aqua regia.

In addition, for example, Patent Document 2 describes that metal impurities on the main surface of the SiC wafer cause deterioration of electrical characteristics of a device. In addition, Patent Document 3 describes a cleaning method in which metal impurities remaining on the main surface of the SiC wafer can be reduced.

PATENT DOCUMENTS

[Patent Document 1] Japanese Patent No. 7095765
[Patent Document 2] PCT International Publication No. WO2020/235225
[Patent Document 3] Japanese Unexamined Patent Application, First Publication No. 2022-51689

SUMMARY OF THE INVENTION

Even if a SiC epitaxial layer is formed on a SiC wafer of which a main surface has a low metal impurity concentration, local surface roughness may occur around the outer circumferential end of the SiC epitaxial layer. This local surface roughness becomes more significant as the thickness of the SiC epitaxial layer becomes thicker. When this surface roughness occurs, the effective area of the SiC epitaxial wafer becomes smaller. In addition, SiC devices formed into chips from near the outer circumferential end of the SiC epitaxial wafer may have poorer device performance than SiC devices formed into chips from near the center.

The present invention has been made in view of the above circumstances, and an object of the present invention is to provide a SiC wafer and a SiC epitaxial wafer with a low impurity content in an end region.

An end region of a SiC epitaxial wafer about several millimeters from the outermost circumference is called an edge exclusion region. The edge exclusion region is excluded from the acquisition region of the SiC device, and the state of this region has not received much attention. However, the inventors found that metal impurities remain more easily in this region than in the main surface, and the metal impurities remaining in this region cause surface roughness in the end region of the SiC epitaxial layer. The present invention provides the following aspects in order to address the above problems.

(1) A SiC wafer according to a first aspect includes an end region within 5 mm from an outer circumferential end, wherein, in the end region, the concentration of each of Ti, V and Zr is $5.0 \times 10^{11}$ atoms/cm$^2$ or less, the concentration of each of Cr, Ni, Cu, W, Mo and Mn is $1.0 \times 10^{11}$ atoms/cm$^2$ or less, and the concentration of each of B, Al and Fe is $5.0 \times 10^{12}$ atoms/cm$^2$ or less.

(2) In the SiC wafer according to the above aspect, in the end region, the concentration of each of Ti and V may be $3.0 \times 10^{11}$ atoms/cm$^2$ or less, the concentration of each of Cr and Zr may be $5.0 \times 10^{10}$ atoms/cm$^2$ or less, the concentration of each of Ni and Cu may be $3.0 \times 10^{10}$ atoms/cm$^2$ or less, the concentration of B may be $3.0 \times 10^{12}$ atoms/cm$^2$ or less, and the concentration of each of Al and Fe may be $1.0 \times 10^{11}$ atoms/cm$^2$ or less.

(3) The SiC wafer according to the above aspect may have a diameter of 149 mm or more.

(4) The SiC wafer according to the above aspect may have a diameter of 199 mm or more.

(5) The SiC wafer according to the above aspect may have a notch cut toward the inside of the SiC wafer.

(6) A SiC epitaxial wafer according to a second aspect includes the SiC wafer according to the above aspect and a SiC epitaxial layer formed on one surface of the SiC wafer.

In the SiC wafer according to the above aspect, the amount of impurities contained in the end region is small and surface roughness in the vicinity of the end region of the SiC epitaxial layer is less likely to occur. In addition, in the SiC wafer according to the above aspect, impurities vaporized from the SiC wafer according to high-temperature annealing during SiC device production can be prevented from being reintroduced into the SiC device. As a result, the width of the edge exclusion region of the SiC epitaxial wafer can be narrowed, and the effective area that can be used to obtain devices from the SiC epitaxial wafer can be increased.

DETAILED DESCRIPTION OF THE INVENTION

Figure 1:
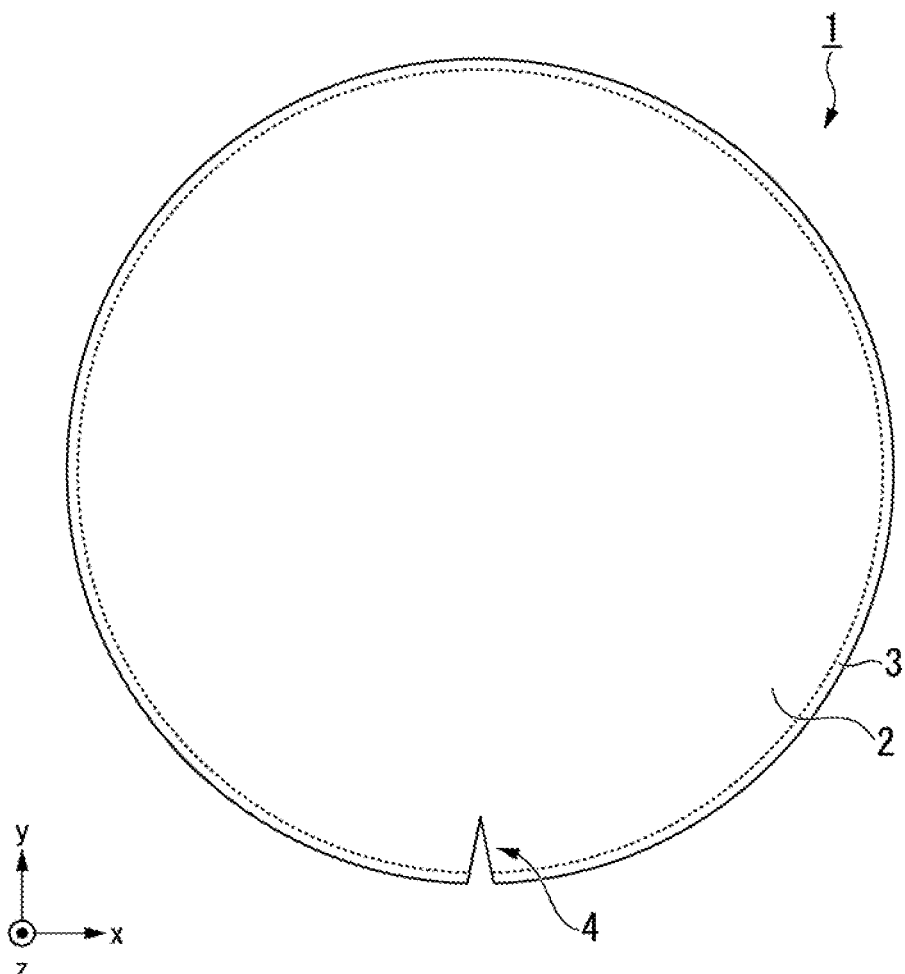
FIG. 1 is a plan view of a SiC wafer according to the present embodiment.

Hereinafter, a SiC wafer according to the present embodiment and the like will be appropriately described in detail with reference to the drawings. In the drawings used in the following description, in order to facilitate understanding of features of the present embodiment, characteristic parts are enlarged for convenience of illustration in some cases, and the dimensional proportions of components may be different from actual components. Materials, sizes and the like exemplified in the following descriptions are examples, the present invention is not limited thereto, and can be appropriately changed and implemented within ranges without changing the scope and spirit of the invention.

FIG. 1 is a plan view of a SiC wafer 1 according to the present embodiment. The SiC wafer 1 is, for example, an n-type SiC. The polytype of the SiC wafer 1 is not particularly limited, and may be any of 2H, 3C, 4H, and 6H. The SiC wafer 1 is, for example, 4H—SiC.

The shape of the SiC wafer 1 in a plan view is a substantially circular shape. The SiC wafer 1 may have an orientation flat or a notch 4 for determining the direction of the crystal axis. The diameter of the SiC wafer 1 is, for example, 149 mm or more, and preferably 199 mm or more. The orientation flat is formed parallel to the <11–20> direction. The notch 4 is cut toward the inside of the SiC wafer 1.

The SiC wafer 1 includes a main region 2 and an end region 3. The main region 2 is a region constituting the main surface of the SiC wafer 1 and is positioned further inside the SiC wafer 1 than the end region 3. The end region 3 is a region within 5 mm from the outer circumferential end of the SiC wafer 1. The end region 3 includes an edge exclusion region. The edge exclusion region is a region of the SiC wafer 1 that is excluded from the acquisition region of the SiC device. The end region 3 and the edge exclusion region do not necessarily match, and the edge exclusion region is preferably narrower than the end region 3.

The end region 3 may contain impurities. Examples of impurities include Ti, V, Fe, W, Mo, Mn, Cr, Ni, Cu, Zr, B and Al. These impurities are the slurry residue when the SiC wafer 1 is subjected to CMP polishing. The end region 3 has a higher surface roughness than the main region 2, and impurities are more likely to remain in the end region 3 than in the main region 2.

In the end region 3, the concentration of each of Ti, V and Zr is $5.0 \times 10^{11}$ atoms/cm$^2$ or less, the concentration of each of Cr, Ni, Cu, W, Mo and Mn is $1.0 \times 10^{11}$ atoms/cm$^2$ or less, and the concentration of each of B, Al and Fe is $5.0 \times 10^{12}$ atoms/cm$^2$ or less. In addition, in the end region 3, preferably, the concentration of each of Ti and V is $3.0 \times 10^{11}$ atoms/cm$^2$ or less, the concentration of each of Cr and Zr is $5.0 \times 10^{10}$ atoms/cm$^2$ or less, the concentration of each of Ni and Cu is $3.0 \times 10^{10}$ atoms/cm$^2$ or less, the concentration of B is $3.0 \times 10^{12}$ atoms/cm$^2$ or less, and the concentration of each of Al and Fe is $1.0 \times 10^{11}$ atoms/cm$^2$ or less. These impurity concentrations of the end region 3 can only be determined through a predetermined cleaning process to be described below.

Figure 2:
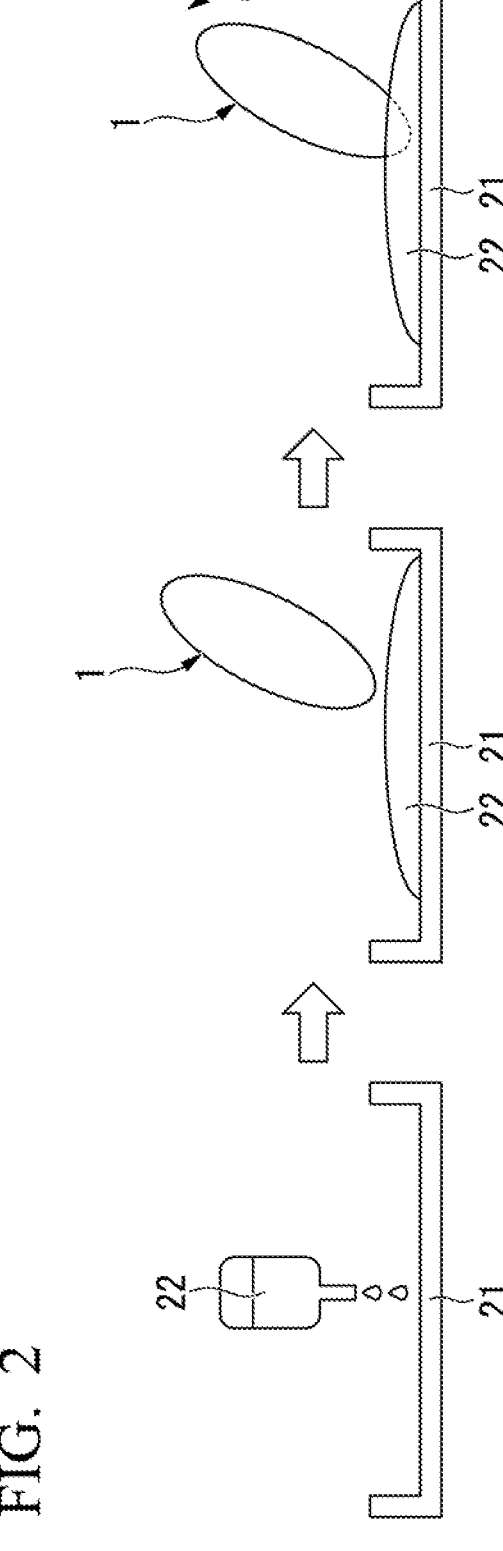
FIG. 2 is a diagram for illustrating a method of measuring an impurity concentration in an end region of the SiC wafer according to the present embodiment.

FIG. 2 is a diagram for illustrating a method of measuring an impurity concentration in the end region 3 of the SiC wafer 1 according to the present embodiment. First, a chemical solution 22 is added dropwise to a Petri dish 21. As the chemical solution 22, for example, a mixed solution containing hydrofluoric acid and a hydrogen peroxide solution can be used. Next, the end region 3 of the SiC wafer 1 is brought into contact with the chemical solution 22. Then, the SiC wafer 1 is rotated while the end region 3 and the chemical solution 22 are in contact with each other. Impurities contained in the end region 3 are extracted into the chemical solution 22. Then, the chemical solution 22 after the impurities have been extracted is evaluated through inductively coupled plasma mass spectrometry (ICP-MS). Then, each impurity concentration measured by ICP-MS corresponds to the impurity concentration of the end region 3.

Ti, V, Fe, W, Mo, Mn, Cr, Ni, Cu and Zr contained in the end region 3 cause local surface roughness of the SiC epitaxial layer that grows in the vicinity of the end region 3. This is because these impurities cause abnormal growth of the SiC epitaxial layer. The end region 3 includes an edge exclusion region, most of which is excluded from the acquisition region of the SiC device and has therefore not received much attention until now, and is considered to be a region that does not need to be considered. However, it has been found that the impurities contained in the end region 3 also affect the surface roughness of the SiC epitaxial layer.

In addition, B and Al contained in the end region 3 may be vaporized from the SiC wafer 1 according to high-temperature annealing during SiC device production and may be reintroduced into the SiC device. When B or Al is reintroduced into the SiC device, it causes performance deterioration of the SiC device. A small amount of B and Al contained in the end region 3 has been ignored until now, but as the performance of the SiC device improves, it has become necessary to reduce even the small amount of B and Al contained in the end region 3.

Figure 3:
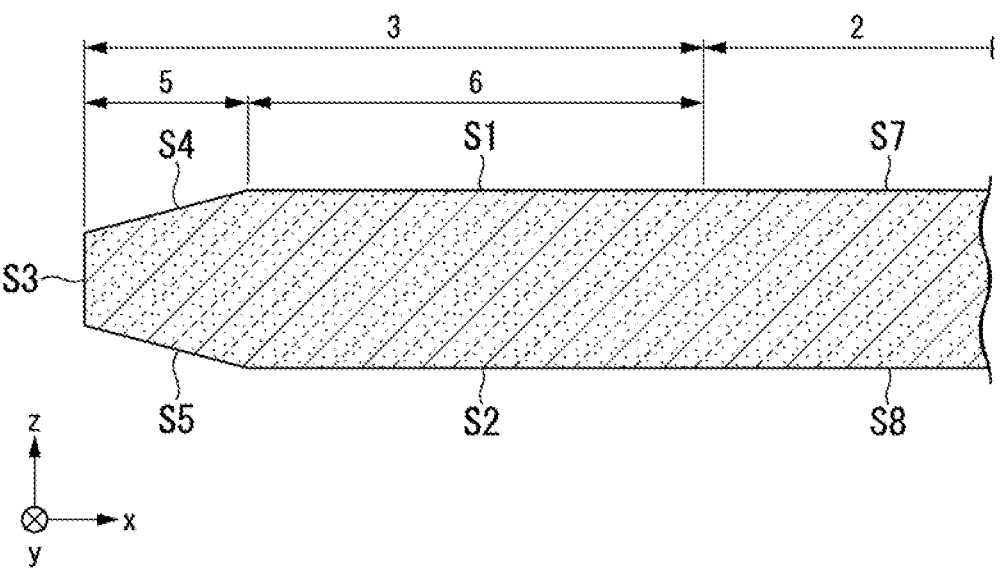
FIG. 3 is a cross-sectional view of an end region of the SiC wafer according to the present embodiment.

FIG. 3 is a cross-sectional view of the end region 3 of the SiC wafer 1 according to the present embodiment. The end region 3 includes, for example, a bevel part 5 and a flat part 6. The bevel part 5 is a part that is positioned on the outer circumference side of the end region 3 and is formed by cutting off the corner of the end of the SiC wafer 1. The width of the bevel part 5 in the radial direction may be, for example, 76 μm or more and 508 μm or less. The bevel part 5 prevents cracking and breaking of the SiC wafer 1. The flat part 6 is a part of the end region 3 that is positioned further inside the SiC wafer 1 than the bevel part 5.

The bevel part 5 has, for example, a first main surface S1, a second main surface S2, an end surface S3, a first chamfered surface S4 and a second chamfered surface S5.

The first main surface S1 is continuous with a first main surface S7 of the main region 2. The first main surface S7 of the main region 2 is one surface of the SiC wafer 1. The first main surface S1 and the first main surface S7 are, for example, a Si surface. The surface roughness of each of the first main surface S1 and the first main surface S7 is 0.1 nm or less. The surface roughness is the arithmetic mean roughness (Ra), which is the same for the following second main surface S2, end surface S3, first chamfered surface S4, and second chamfered surface S5.

The second main surface S2 is continuous with a second main surface S8 of the main region 2. The second main surface S2 faces the first main surface S1. The second main surface S8 faces the first main surface S7. The second main surface S2 and the second main surface S8 are, for example, a C surface. The surface roughness of each of the second main surface S2 and the second main surface S8 is 0.1 nm or less.

The end surface S3 is a surface that forms the outermost circumference of the SiC wafer 1. The end surface S3 extends in a direction perpendicular to the xy plane including the first main surface S1. The end surface S3 has a higher surface roughness than the first main surface S1 and the second main surface S2. Particularly, the end surface S3 forming the notch 4 has a higher surface roughness than the first main surface Si and the second main surface S2, and has a higher surface roughness than the end surface S3 in a part other than the notch 4.

The surface roughness of the end surface S3 in a part other than the notch 4 is, for example, 200 nm or less. The surface roughness of the end surface S3 in a part other than the notch 4 is, for example, 150 nm or more and 200 nm or less. The surface roughness of the end surface S3 of the part of the notch 4 is, for example, 250 nm or less. The surface roughness of the end surface S3 of the part of the notch 4 is, for example, 200 nm or more and 250 nm or less.

The first chamfered surface S4 is a surface connecting one side of the end surface S3 and one side of the first main surface S1. Although the first chamfered surface S4 shown in FIG. 3 is an inclined surface, the first chamfered surface S4 may be a curved surface. The first chamfered surface S4 has a higher surface roughness than the first main surface S1. Particularly, the first chamfered surface S4 forming the notch 4 has a higher surface roughness than the first main surface S1, and has a higher surface roughness than the first chamfered surface S4 of the part other than the notch 4.

The surface roughness of the first chamfered surface S4 in a part other than the notch 4 is, for example, 90 nm or less. The surface roughness of the first chamfered surface S4 in a part other than the notch 4 is, for example, 40 nm or more and 90 nm or less. The surface roughness of the first chamfered surface S4 of the part of the notch 4 is, for example, 150 nm or less. The surface roughness of the first chamfered surface S4 of the part of the notch 4 is, for example, 100 nm or more and 150 nm or less.

The second chamfered surface S5 is a surface connecting one side of the end surface S3 and one side of the second main surface S2. Although the second chamfered surface S5 shown in FIG. 3 is an inclined surface, the second chamfered surface S5 may be a curved surface. The second chamfered surface S5 has a higher surface roughness than the second main surface S2. Particularly, the second chamfered surface S5 forming the notch 4 has a higher surface roughness than the second main surface S2, and has a higher surface roughness than the second chamfered surface S5 in a part other than the notch 4.

The surface roughness of the second chamfered surface S5 in a part other than the notch 4 is, for example, 100 nm or less. The surface roughness of the second chamfered surface S5 in a part other than the notch 4 is, for example, 50 nm or more and 100 nm or less. The surface roughness of the second chamfered surface S5 of the part of the notch 4 is, for example, 150 nm or less. The surface roughness of the second chamfered surface S5 of the part of the notch 4 is, for example, 100 nm or more and 150 nm or less.

As described above, the end surface S3, the first chamfered surface S4 and the second chamfered surface S5 constituting the bevel part 5 have a higher surface roughness than the first main surface S7 and the second main surface S8 in the main region 2. Impurities are likely to remain in these parts having high surface roughness. Impurities in these parts are reduced through a cleaning process to be described below.

The main region 2 may contain the above impurities. The amount of the metal impurities contained in the main region 2 is smaller than that of the impurities contained in the end region 3.

For example, in the main region 2, the concentration of each of Ti, V, Cr, Mn, Fe, Ni, Cu, Mo, and W is preferably $1.0 \times 10^{10}$ atoms/cm$^2$ or less.

An example of a method of producing the SiC wafer 1 according to the present embodiment will be described. First, a SiC ingot is sliced and the SiC wafer 1 is taken out. The SiC ingot is obtained by, for example, a sublimation method.

Next, the main surface of the SiC wafer 1 is polished. The main surface of the SiC wafer 1 is subjected to, for example, CMP polishing. One surface of the SiC wafer 1 may be polished or both surfaces thereof may be polished. For example, in the case of one-surface polishing, one surface of the SiC wafer 1 is attached to a pressure head, and the surface opposite to the SiC wafer 1 is pressed against the polishing cloth. The SiC wafer 1 is rotated while a polishing slurry is supplied to the polishing cloth. The SiC wafer 1 may auto-rotate while revolving with respect to the pressure head. The rotation directions of revolution and autorotation may be the same or opposite. The polishing slurry includes abrasive grains, an oxidizing agent and the like. Examples of abrasive grains include colloidal silica, aluminum oxide, and diamond. The oxidizing agent contains one or more metal elements selected from the group consisting of Ti, V, W, Mo, Mn, Cr, Ni, Cu, and Zr. In addition, the polishing slurry may contain Fe, Al, B and the like as impurities.

Next, the polished SiC wafer 1 is cleaned. Cleaning is performed by performing immersion in various cleaning solutions filled into a cleaning tank. The cleaning solution is filtered using a filter and circulated by a pump. Cleaning includes, for example, acid cleaning using ultrasonic waves, sulfuric acid-hydrogen peroxide mixture cleaning, hydrofluoric acid cleaning, ammonia-hydrogen peroxide mixture cleaning, and hydrochloric acid-hydrogen peroxide mixture cleaning. Cleaning is performed, for example, in the order of acid cleaning using ultrasonic waves, sulfuric acid-hydrogen peroxide mixture cleaning, hydrofluoric acid cleaning, ammonia-hydrogen peroxide mixture cleaning, and hydrochloric acid-hydrogen peroxide mixture cleaning. In addition, before acid cleaning using ultrasonic waves, alkaline cleaning may be performed. In addition, pure water cleaning may be performed between respective cleaning processes.

The SiC wafer 1 is attached to a cassette and immersed in a cleaning tank. The wafer support part of the cassette supports the end surface of the SiC wafer 1. The wafer support part of the cassette and the SiC wafer 1 are brought into point-contact with each other. In addition, in each cleaning process, cleaning is performed in a plurality of steps while changing the contact position between the SiC wafer 1 and the wafer support part. Although the part in which the SiC wafer 1 and the wafer support part are in contact tends to be insufficiently cleaned, insufficient cleaning of the SiC wafer 1 can be avoided by changing the contact point.

Alkaline cleaning is performed using, for example, potassium hydroxide and a surfactant. When alkaline cleaning is performed, some of abrasive grains and organic substances attached to the SiC wafer 1 are removed. Alkaline cleaning is performed, for example, at room temperature for 10 minutes or longer.

Acid cleaning using ultrasonic waves is performed using hydrochloric acid or oxalic acid and a chelating agent. The chelating agent is, for example, ethylenediaminetetraacetic acid. Ultrasonic waves with at least two types of frequencies in combination are used. For example, a combination of a high frequency band of 200 kHz or more and 500 kHz or less and a frequency band of 1 MHz or more and 2 MHz or less, which is called megasonic, may be used. Acid cleaning is performed, for example, at a temperature of 50° C. or higher. Ultrasonic cleaning for each frequency band is performed for 10 minutes or longer. For example, ultrasonic cleaning for each frequency band may be performed a plurality of times in units of 10 minutes. Whenever ultrasonic cleaning is performed, the contact point between the wafer support part of the cassette and the SiC wafer 1 is changed.

In addition, in acid cleaning using ultrasonic waves, in addition to ultrasonic waves in these two frequency bands, ultrasonic waves in a low frequency band of 40 kHz or more and 100 kHz or less may be additionally combined. When low-frequency ultrasonic waves are added, even if the SiC wafer 1 has the notch 4, impurities in the notch 4 can be removed. In addition, when cleaning is performed using ultrasonic waves in a high frequency band of 200 kHz or more and 500 kHz or less, the frequency of ultrasonic waves may be periodically varied.

In sulfuric acid-hydrogen peroxide mixture cleaning, organic substances attached to the SiC wafer 1 can be removed using sulfuric acid-hydrogen peroxide mixture. Sulfuric acid-hydrogen peroxide mixture is a solution in which sulfuric acid and a hydrogen peroxide solution are mixed. Sulfuric acid is, for example, sulfuric acid with a mass percentage concentration of 98%, and the hydrogen peroxide solution is, for example, a hydrogen peroxide solution with a mass percentage concentration of 30%. The volume ratio of sulfuric acid and a hydrogen peroxide solution is, for example, sulfuric acid-hydrogen peroxide solution=1:1 to 1:4. The volume proportion of the hydrogen peroxide solution may be, for example, 1 times or more and 4 times or less that of sulfuric acid. Sulfuric acid-hydrogen peroxide mixture cleaning is performed, for example, at a temperature of 100° C. or higher. Sulfuric acid-hydrogen peroxide mixture cleaning is performed, for example, for 10 minutes or longer.

In hydrofluoric acid cleaning, an oxide film formed on the surface of the SiC wafer 1 is removed using hydrofluoric acid. Hydrofluoric acid is a mixture of hydrofluoric acid and ultrapure water, and the volume proportion of ultrapure water is, for example, 1 times or more and 9 times or less that of hydrofluoric acid. Hydrofluoric acid cleaning is performed, for example, at room temperature for 10 minutes or longer.

In ammonia-hydrogen peroxide mixture cleaning, organic substances attached to the SiC wafer 1 can be removed using ammonia-hydrogen peroxide mixture. Ammonia-hydrogen peroxide mixture is a solution in which an ammonia aqueous solution, a hydrogen peroxide solution, and ultrapure water are mixed. The ammonia aqueous solution is, for example, an ammonia aqueous solution with a mass percentage concentration of 28%. The volume ratio of the ammonia aqueous solution, the hydrogen peroxide solution and ultrapure water is, for example, ammonia aqueous solution:hydrogen peroxide solution:ultrapure water=1:1:10 to 1:1:23. The volume proportion of ultrapure water may be, for example, 10 times or more and 23 times or less that of ammonia water. Ammonia-hydrogen peroxide mixture cleaning is performed, for example, at room temperature for 10 minutes or longer.

In hydrochloric acid-hydrogen peroxide mixture cleaning, metals other than those derived from the metal catalyst remaining on the SiC wafer are removed using hydrochloric acid-hydrogen peroxide mixture. Hydrochloric acid-hydrogen peroxide mixture is a solution in which hydrochloric acid, a hydrogen peroxide solution, and ultrapure water are mixed. Hydrochloric acid is, for example, concentrated hydrochloric acid with a mass percentage concentration of 98%. The volume ratio of hydrochloric acid, a hydrogen peroxide solution and ultrapure water is, for example, hydrochloric acid:hydrogen peroxide solution:ultrapure water=1:1:10 to 1:1:23. The volume proportion of ultrapure water may be, for example, 10 times or more and 23 times or less that of hydrochloric acid. Hydrochloric acid-hydrogen peroxide mixture cleaning is performed, for example, at room temperature for 10 minutes or longer.

Examples of SiC wafer cleaning methods are summarized in the following Table 1.

TABLE 1

| | Alkaline cleaning | Acid cleaning | | | Sulfuric acid-hydrogen peroxide mixture cleaning | Hydrofluoric acid cleaning | Ammonia-hydrogen peroxide mixture cleaning | Hydrochloric acid-hydrogen peroxide mixture cleaning |
| --- | --- | --- | --- | --- | --- | --- | --- | --- |
| Cleaning solution | alkaline<br>surfactant | hydrochloric acid or oxalic acid<br>chelating agent | hydrochloric acid or oxalic acid<br>chelating agent | hydrochloric acid or oxalic acid<br>chelating agent | sulfuric acid<br>hydrogen peroxide solution | hydrofluoric acid<br>ultrapure water | ammonia<br>hydrogen peroxide solution<br>ultrapure water | hydrochloric acid<br>hydrogen peroxide solution<br>ultrapure water |
| Concentration | | | | | 1:1 to 1:4 | 1:1 to 1:9 | 1:1:10 to 1:1:23 | 1:1:10 to 1:1:23 |
| Temperature | room temperature | 50° C. | 50° C. | 50° C. | 100° C. | room temperature | room temperature | room temperature |
| Time | | 10 minutes × 2 times | 10 minutes × 2 times | 10 minutes × 2 times | 10 minutes | 10 minutes | 10 minutes | 10 minutes |

TABLE 1-continued

| | Alkaline cleaning | Acid cleaning | | | Sulfuric acid-hydrogen peroxide mixture cleaning | Hydrofluoric acid cleaning | Ammonia-hydrogen peroxide mixture cleaning | Hydrochloric acid-hydrogen peroxide mixture cleaning |
|---|---|---|---|---|---|---|---|---|
| Ultrasonic waves | — | 40 kHz or more and 100 kHz | 200 kHz or more and 500 kHz, with sweep | 1 MHz or more and 2 MHz or less | — | — | — | — |

As described above, when cleaning using ultrasonic waves in different frequency bands is performed, most of impurities remaining in the end region 3 and the notch 4 with high surface roughness can be removed, and it is possible to produce the SiC wafer 1 in which the concentration of these impurities in the end region 3 and the notch 4 is a predetermined value or less.

In the SiC wafer 1 according to the present embodiment, the concentration of impurities contained in the end region 3 is a predetermined value or less. Therefore, abnormal growth of the SiC epitaxial layer is less likely to occur in the vicinity of the end region 3, and local surface roughness of the SiC epitaxial layer is less likely to occur. In addition, in the SiC wafer 1 according to the present embodiment, it is possible to prevent impurities from being vaporized from the SiC wafer 1 according to high-temperature annealing during SiC device production and being reintroduced into the SiC device, and it is possible to reduce performance deterioration of the SiC device. In addition, if the surface roughness of the SiC epitaxial layer is reduced and reintroduction of impurities into the SiC device is reduced, the effective region of the SiC wafer 1 can be widened and the width of the edge exclusion region can be narrowed.

Figure 4:
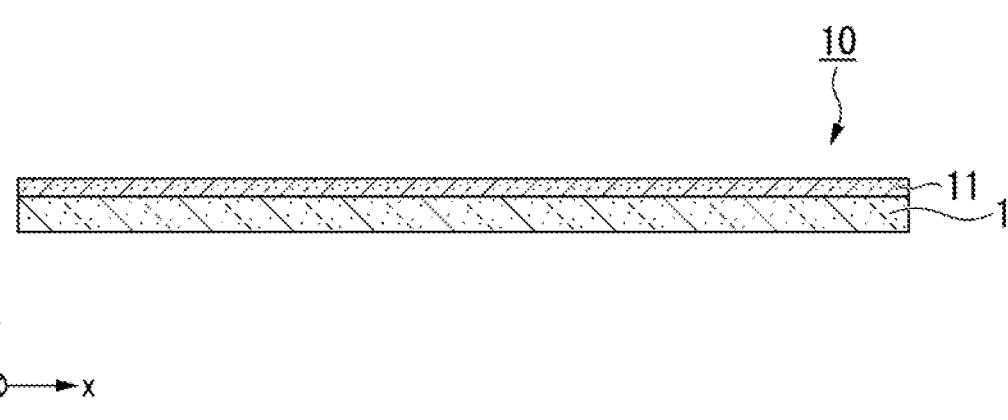
FIG. 4 is a cross-sectional view of a SiC epitaxial wafer according to the present embodiment.

A SiC epitaxial wafer can be produced using the SiC wafer 1 according to the present embodiment. FIG. 4 is a cross-sectional view of the SiC epitaxial wafer according to the present embodiment. A SiC epitaxial wafer 10 shown in FIG. 4 includes the above SiC wafer 1 and a SiC epitaxial layer 11. In the SiC wafer 1, since the impurity concentration in the end region 3 is low, the surface of the SiC epitaxial layer 11 is less likely to be roughened after the SiC epitaxial layer 11 is formed. The thickness of the SiC epitaxial layer 11 can be, for example, a thickness of 1 μm to 100 μm. Since the surface roughness is larger as the epitaxial film is thicker, when the thickness of the epitaxial film is 25 μm or more, the effects of the present invention are significant.

While preferable embodiments of the present invention have been described above in detail, the present invention is not limited to these specific embodiments, and various modifications and alternations can be made in a range within the spirit and scope of the present invention described in the scope of the claims.

EXAMPLES

Example 1

A 6-inch SiC single-crystal wafer having an off angle of 4° was prepared as a SiC single-crystal wafer. First, the outer circumferential end of the SiC single-crystal wafer was subjected to outer circumference grinding using a #600 polishing grindstone. Next, both surfaces of the SiC wafer were subjected to CMP polishing using colloidal silica as a polishing slurry.

Next, the polished SiC wafer was subjected to alkaline cleaning, acid cleaning using ultrasonic waves, sulfuric acid-hydrogen peroxide mixture cleaning, hydrofluoric acid cleaning, ammonia-hydrogen peroxide mixture cleaning, and hydrochloric acid-hydrogen peroxide mixture cleaning in order. Pure water cleaning was inserted after each cleaning process.

Alkaline cleaning was performed using potassium hydroxide and sodium alcohol ethoxy sulfate at room temperature for 10 minutes.

Acid cleaning using ultrasonic waves was performed using a mixed solution containing hydrochloric acid and ethylenediaminetetraacetic acid. Acid cleaning was performed separately three times by changing the frequency of ultrasonic waves applied to a cleaning tank. The temperature of the cleaning solution during acid cleaning was 50° C.

First ultrasonic cleaning was performed using ultrasonic waves in a low frequency band of 40 kHz or more and 100 kHz or less. The first ultrasonic cleaning was performed once for 10 minutes.

Second ultrasonic cleaning was performed using ultrasonic waves in a high frequency band of 200 kHz or more and 500 kHz or less. In addition, the frequency of ultrasonic waves was not set to a certain frequency in this frequency band, but was periodically changed. The second ultrasonic cleaning was performed once for 10 minutes.

Third ultrasonic cleaning was performed using ultrasonic waves with a frequency of 1 MHz or more and 2 MHz or less, which is called megasonic. The third ultrasonic cleaning was performed once for 10 minutes.

Sulfuric acid-hydrogen peroxide mixture cleaning was performed using a mixed solution in which 98% of sulfuric acid and 30% of a hydrogen peroxide solution were mixed at a ratio of 1:1. The sulfuric acid-hydrogen peroxide mixture cleaning was performed at 100° C. for 10 minutes.

Hydrofluoric acid cleaning was performed using a mixed solution in which hydrofluoric acid and ultrapure water were mixed at a ratio of 1:4. The hydrofluoric acid cleaning was performed at room temperature for 10 minutes.

Ammonia-hydrogen peroxide mixture cleaning was performed using a mixed solution in which an ammonia aqueous solution, a hydrogen peroxide solution and ultrapure water were mixed at a ratio of 1:1:18. The ammonia-hydrogen peroxide mixture cleaning was performed at room temperature for 10 minutes.

Hydrochloric acid-hydrogen peroxide mixture cleaning was performed using a mixed solution in which hydrochloric acid, a hydrogen peroxide solution and ultrapure water were mixed at a ratio of 1:1:18. The hydrochloric acid-hydrogen peroxide mixture cleaning was performed at room temperature for 10 minutes.

Then, the cleaned SiC wafer was taken out and dried. Next, the impurity concentration in the end region of the SiC wafer was measured using ICP-MS. The impurity concentration in the end region 3 was measured by the procedure shown in FIG. 2. ICP-MS was performed using SPQ9400 (commercially available from SII NanoTechnology Inc.).

Example 2

Example 2 differed from Example 1 in that cleaning conditions for the polished SiC wafer were changed. Specifically, first ultrasonic cleaning, second ultrasonic cleaning, and third ultrasonic cleaning were each performed twice for 10 minutes. The contact position between the SiC wafer and the wafer support part of the cassette was changed after ultrasonic cleaning was performed for 10 minutes.

Comparative Example 1

Comparative Example 1 differed from Example 1 in that the polished SiC wafer was not subjected to acid cleaning using ultrasonic waves. In Comparative Example 1, the polished SiC wafer was subjected to alkaline cleaning, sulfuric acid-hydrogen peroxide mixture cleaning, hydrofluoric acid cleaning, ammonia-hydrogen peroxide mixture cleaning, and hydrochloric acid-hydrogen peroxide mixture cleaning in order. Pure water cleaning was inserted after each cleaning process. Cleaning conditions in each cleaning process were the same as in Example 1.

Then, the cleaned SiC wafer was taken out and dried. Next, the impurity concentration in the end region of the SiC wafer of Comparative Example 1 was measured using ICP-MS. The impurity concentration in the end region 3 was measured by the procedure shown in FIG. 2.

The impurity concentrations measured in Example 1 and Comparative Example 1 are shown in the following Table 2. In Table 2, "-" indicates unmeasured data.

TABLE 2

| | Impurity concentration (atoms/cm²) | | |
|---|---|---|---|
| | Example 1 | Example 2 | Comparative Example 1 |
| B | $3.4 \times 10^{12}$ | $2.0 \times 10^{12}$ or less | $5.6 \times 10^{12}$ |
| Al | $7.3 \times 10^{11}$ | $9.0 \times 10^{10}$ or less | $4.5 \times 10^{12}$ |
| Ti | $4.5 \times 10^{11}$ | $2.0 \times 10^{11}$ or less | $8.0 \times 10^{11}$ |
| V | $3.0 \times 10^{11}$ or less | $3.0 \times 10^{11}$ or less | — |
| Cr | $6.1 \times 10^{10}$ | $5.0 \times 10^{10}$ or less | $2.4 \times 10^{11}$ |
| Mn | $9.0 \times 10^{10}$ or less | $9.0 \times 10^{10}$ or less | — |
| Fe | $2.8 \times 10^{11}$ | $3.0 \times 10^{10}$ or less | $2.2 \times 10^{13}$ |
| Ni | $4.0 \times 10^{10}$ | $3.0 \times 10^{10}$ or less | $7.2 \times 10^{10}$ |
| Cu | $3.2 \times 10^{10}$ | $2.0 \times 10^{10}$ or less | $4.9 \times 10^{10}$ |
| Zr | $1.3 \times 10^{11}$ | $3.0 \times 10^{10}$ or less | $7.3 \times 10^{11}$ |
| Mo | $2.0 \times 10^{10}$ or less | $2.0 \times 10^{10}$ or less | — |
| W | $7.0 \times 10^{10}$ or less | $7.0 \times 10^{10}$ or less | — |

In addition, using the SiC wafers of Example 1 and Comparative Example 1, SiC epitaxial layers were formed. The thickness of the SiC epitaxial layer was 30 μm. Then, the surface roughness of the formed SiC epitaxial layer was determined. The results are summarized in the following Table 3. The surface roughness was the root mean square height (Rq). In addition, the second region in Table 3 was a region to 3 mm from the outer circumferential end, and the first region was a region excluding the second region from the entire region.

TABLE 3

| | Rq/nm | |
|---|---|---|
| | Example 1 | Comparative Example 1 |
| Entire surface | 0.318 | 0.374 |
| First region | 0.309 | 0.338 |
| Second region | 0.402 | 0.757 |

As shown in Table 3, the surface roughness of Example 1 was smaller than the surface roughness of Comparative Example 1. In addition, it can be understood that the effect of reducing the impurity concentration in the end region reached the first region 3 mm or more inside from the outer circumferential end.

EXPLANATION OF REFERENCES

1 SiC wafer
2 Main region
3 End region
4 Notch
5 Bevel part
6 Flat part
10 SiC epitaxial wafer
11 SiC epitaxial layer
21 Petri dish
22 Chemical solution
S1, S7 First main surface
S2, S8 Second main surface
S3 End surface
S4 First chamfered surface
S5 Second chamfered surface

What is claimed is:

1. A SiC wafer including an end region within 5 mm from an outer circumferential end,
   wherein, in the end region,
   the concentration of each of Ti, V and Zr is $5.0 \times 10^{11}$ atoms/cm² or less,
   the concentration of each of Cr, Ni, Cu, W, Mo and Mn is $1.0 \times 10^{11}$ atoms/cm² or less, and
   the concentration of each of B, Al and Fe is $5.0 \times 10^{12}$ atoms/cm² or less.

2. The SiC wafer according to claim 1,
   wherein, in the end region,
   the concentration of each of Ti and V is $3.0 \times 10^{11}$ atoms/cm² or less,
   the concentration of each of Cr and Zr is $5.0 \times 10^{10}$ atoms/cm² or less,
   the concentration of each of Ni and Cu is $3.0 \times 10^{10}$ atoms/cm² or less,
   the concentration of B is $3.0 \times 10^{12}$ atoms/cm² or less, and
   the concentration of each of Al and Fe is $1.0 \times 10^{11}$ atoms/cm² or less.

3. The SiC wafer according to claim 1, which has a diameter of 149 mm or more.

4. A SiC epitaxial wafer, comprising:
   the SiC wafer according to claim 2; and
   a SiC epitaxial layer formed on one surface of the SiC wafer.

5. The SiC wafer according to claim 3, which has a diameter of 199 mm or more.

6. A SiC epitaxial wafer, comprising:
   the SiC wafer according to claim 3; and
   a SiC epitaxial layer formed on one surface of the SiC wafer.

13

14

7. A SiC epitaxial wafer, comprising:
the SiC wafer according to claim 5; and
a SiC epitaxial layer formed on one surface of the SiC wafer.

8. The SiC wafer according to claim 1, which has a notch cut toward the inside of the SiC wafer.

9. A SiC epitaxial wafer, comprising:
the SiC wafer according to claim 8; and
a SiC epitaxial layer formed on one surface of the SiC wafer.

10. A SiC epitaxial wafer, comprising:
the SiC wafer according to claim 1; and
a SiC epitaxial layer formed on one surface of the SiC wafer.

* * * * *